(12) United States Patent
Mei et al.

(10) Patent No.: US 6,509,955 B2
(45) Date of Patent: Jan. 21, 2003

(54) LENS SYSTEM FOR MASKLESS PHOTOLITHOGRAPHY

(75) Inventors: Wenhui Mei, Plano, TX (US); Takashi Kanatake, Dallas, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/858,711

(22) Filed: May 16, 2001

(65) Prior Publication Data

US 2002/0021426 A1 Feb. 21, 2002

Related U.S. Application Data

(60) Provisional application No. 60/207,038, filed on May 25, 2000.

(51) Int. Cl.[7] .......................... G03B 27/42; G03B 27/54; G03B 27/32; A61N 5/00; G03F 9/00
(52) U.S. Cl. ............................. 355/53; 355/67; 355/69; 355/77; 250/492.2; 250/492.22; 430/4; 430/5; 430/22; 430/311; 430/312
(58) Field of Search ............................. 355/53, 67, 69, 355/77; 250/492.2, 492.22; 430/4, 5, 22, 311, 312

(56) References Cited

U.S. PATENT DOCUMENTS

| | | | |
|---|---|---|---|
| 3,534,467 A | 10/1970 | Sachs et al. .................. 29/583 |
| 4,126,812 A | 11/1978 | Wakefield .................... 313/500 |
| 4,744,047 A | 5/1988 | Okamoto et al. ........... 364/900 |
| 4,879,466 A | 11/1989 | Kitaguchi et al. ..... 250/370.14 |
| 5,049,901 A | 9/1991 | Gelbart ........................ 346/108 |
| 5,079,544 A | 1/1992 | DeMond et al. ............ 340/701 |
| 5,082,755 A | 1/1992 | Liu ................................ 430/5 |
| 5,106,455 A | 4/1992 | Jacobsen et al. ......... 156/659.1 |
| 5,109,290 A | 4/1992 | Imai ............................. 359/54 |
| 5,121,983 A | 6/1992 | Lee ................................ 353/8 |
| 5,131,976 A | 7/1992 | Hoko .......................... 156/630 |
| 5,132,723 A | 7/1992 | Gelbart ......................... 355/40 |
| 5,138,368 A | 8/1992 | Kahn et al. .................... 355/53 |
| 5,208,818 A | 5/1993 | Gelbart et al. ................ 372/30 |
| 5,269,882 A | 12/1993 | Jacobsen ................. 156/659.1 |
| 5,281,996 A | 1/1994 | Bruning et al. ............... 355/77 |

(List continued on next page.)

FOREIGN PATENT DOCUMENTS

| EP | 0552953 | * | 7/1993 | ............. G03F/7/20 |
|---|---|---|---|---|
| WO | 9110170 | * | 7/1991 | ............. G03F/9/00 |

OTHER PUBLICATIONS

"New Multi–EB Direct Write Concept for Maskless High Throughput", Canon SubMicron Focus, vol. 5, Summer 2000.*

Sandstrom and Odselius, "Large–Area High Quality Photomasks", Micronic Laser Systems, published by SPIE, vol. 2621, 1985, pp. 312–318.*

Singh–Gasson, Sangeet et al., Maskless Fabrication of Light–Directed Oligonucleotide Microarrays Using a Digital Micromirror Array, vol. 17, No. 10, Oct. 1999, pp. 974–978.*

Devitt, Terry, "Advanced May Put Gene Chip Technology on Scientists Desktops", http://www.biotech.wise.edu/Education/biotechnews/GeneChip.html, Oct. 7, 1999.*

*Primary Examiner*—Russell Adams
*Assistant Examiner*—Khaled Brown
(74) *Attorney, Agent, or Firm*—Haynes & Boone, LLP

(57) ABSTRACT

A system for performing digital lithography onto a subject is provided. The system utilizes pixel panels to generate pixel patterns. Mirrors are utilized to divert and align the pixel elements forming the patterns onto a subject. A gradient lens system positioned between the panels and the subject simultaneously directs the pixel elements to the subject. The pixel elements may overlapping, adjacent, or spaced as desired. The pixel elements may be directed to multiple surfaces simultaneously. One or more point array units may be utilized in the system to achieve higher resolution.

21 Claims, 8 Drawing Sheets

U.S. PATENT DOCUMENTS

| | | | |
|---|---|---|---|
| 5,300,966 A | 4/1994 | Uehira et al. | 353/30 |
| 5,361,272 A | 11/1994 | Gorelik | 372/50 |
| 5,416,729 A | 5/1995 | Leon et al. | 364/578 |
| 5,431,127 A | 7/1995 | Stevens et al. | 117/75 |
| 5,461,455 A | 10/1995 | Coteus et al. | 355/43 |
| 5,691,541 A * | 11/1997 | Ceglio et al. | |
| 5,793,473 A | 8/1998 | Koyama et al. | 355/55 |
| 5,818,498 A | 10/1998 | Richardson et al. | 347/237 |
| 5,870,176 A | 2/1999 | Sweatt et al. | 355/53 |
| 5,892,231 A | 4/1999 | Baylor et al. | 250/398 |
| 5,900,637 A | 5/1999 | Smith | 250/492.22 |
| 5,905,545 A | 5/1999 | Poradish et al. | 348/743 |
| 5,909,658 A | 6/1999 | Clarke et al. | 702/126 |
| 5,949,557 A | 9/1999 | Powell | 359/8 |
| 5,955,776 A | 9/1999 | Ishikawa | 257/618 |
| 5,995,129 A | 11/1999 | Sunagawa et al. | 347/239 |
| 5,995,475 A | 11/1999 | Gelbart | 369/112 |
| 5,998,069 A | 12/1999 | Cutter et al. | 430/5 |
| 6,014,203 A | 1/2000 | Ohkawa | 355/68 |
| 6,048,011 A | 4/2000 | Fruhling et al. | 294/64.3 |
| 6,052,517 A | 4/2000 | Matsunaga et al. | 395/500.09 |
| 6,061,118 A | 5/2000 | Takeda | 355/47 |
| 6,071,315 A | 6/2000 | Ramamurthi et al. | 716/19 |
| 6,072,518 A | 6/2000 | Gelbart | 347/239 |
| 6,084,656 A | 7/2000 | Choi et al. | 355/71 |
| 6,107,011 A | 8/2000 | Gelbart | 430/397 |
| 6,124,876 A | 9/2000 | Sunagawa | 347/239 |
| 6,133,986 A | 10/2000 | Johnson | 355/67 |
| 6,205,364 B1 | 3/2001 | Lichtenstein et al. | 700/58 |
| 6,251,550 B1 | 6/2001 | Ishikawa | 430/22 |
| 6,295,153 B1 * | 9/2001 | Garner | |
| 6,312,134 B1 * | 11/2001 | Jain et al. | |

* cited by examiner

LENS SYSTEM FOR MASKLESS PHOTOLITHOGRAPHY

CROSS REFERENCE

This invention relies on a provisional patent application U.S. Ser. No. 60/207,038 filed on May 25, 2000.

BACKGROUND

The present invention relates generally to lithographic exposure equipment, and more particularly, to a photolithography system and method, such as can be used in the manufacture of semiconductor integrated circuit devices.

In conventional photolithography systems, the photographic equipment requires a mask for printing a pattern onto a subject. The subject may include, for example, a photo resist coated semiconductor substrate for manufacture of integrated circuits, metal substrate for etched lead frame manufacture, conductive plate for printed circuit board manufacture, or the like. A patterned mask or photomask may include, for example, a plurality of lines, structures, or images. During a photolithographic exposure, the subject must be aligned to the mask very accurately using some form of mechanical control and sophisticated alignment mechanism.

U.S. Pat. No. 5,691,541, which is hereby incorporated by reference, describes a maskless, reticle-free lithography system. The system employs a pulsed or strobed eximer laser to reflect light off a programmable digital mirror device (DMD) for projecting a line image onto a substrate. The substrate is mounted on a stage that is projected during the sequence of pulses.

U.S. Pat. No. 4,925,279, which is hereby incorporated by reference, describes a telecentric F-θ lens system that employs a coherent light source (laser) to direct a beam of light through an F-θ lens system and onto a subject. The beam of light scans a line across the subject to produce a resulting image.

The above-two described systems suffer from a very small exposure area with relatively poor resolution. Being line scanning systems, each system requires a relatively large amount of time for the entire surface of the substrate to be exposed. In addition, the coherent light sources (used for lasers) are not only very expensive, but are unreliable. Further still, F-θ lenses are extremely expensive.

U.S. Pat. Ser./No. 09/480,796, filed Jan. 10, 2000 and hereby incorporated by reference, discloses a novel system and method for photolithography which projects a moving pixel image onto specific sites of a subject. A "site" may represent a single pixel, or a group of pixels, depending on the embodiment. In one embodiment, the method projects a pixel-mask pattern onto a subject such as a wafer. The method provides a sub-pattern to a pixel panel pattern generator such as a deformable mirror device or a liquid crystal display. The pixel panel provides a plurality of pixel elements corresponding to the sub-pattern that may be projected onto the subject.

Each of the plurality of pixel elements is then simultaneously focused to discrete, non-contiguous portions of the subject. The subject and pixel elements are then moved and the sub-pattern is changed responsive to the movement and responsive to the pixel-mask pattern. As a result, light can be projected into the sub-pattern to create the plurality of pixel elements on the subject, and the pixel elements can be moved and altered, according to the pixel-mask pattern, to create a contiguous image on the subject.

Certain improvements are desired for maskless photolithograph systems in general, such as the above-described systems and methods. For example, it is desirable to have a relatively large exposure area, to provide good image resolution, to provide good redundancy, to use a relatively inexpensive incoherent light source, to provide high light energy efficiency, to provide high productivity and resolution, and to be more flexible and reliable.

SUMMARY

A technical advance is provided by a novel method and system for performing digital lithography onto a subject. In one embodiment, the system comprises first and second panels for generating first and second patterns, each pattern comprising a plurality of pixel elements, a first mirror for diverting the pixel elements of the first pattern to align with the pixel elements of the second pattern, a first gradient lens system positioned between the first and second panels and the subject for simultaneously directing the pixel elements to the subject, and means for providing relative movement between the first and second panels and the subject to scan the pixel elements across the subject.

In another embodiment, the system comprises third and fourth panels for generating third and fourth patterns, a second mirror for diverting the pixel elements of the third pattern to align with the pixel elements of the fourth pattern, and a second gradient lens system positioned between the third and fourth panels and the subject for simultaneously directing the pixel elements to the subject. The system is operable to scan the pixel elements from the first and second panels across a first surface of the subject, and to scan the pixel elements from the third and fourth panels across a second surface of the subject. In yet another embodiment, the first and second surfaces are on opposite sides of the subject.

In still another embodiment, the system comprises a point array unit and means for providing relative movement between the unit and a subject to scan the pixel elements across the subject. The point array unit includes a panel for generating the pattern, a first lens system positioned between the panel and the subject for directing the pixel elements to the subject, and a second lens system for focusing the pixel elements.

DETAILED DESCRIPTION

The present disclosure relates to exposure systems, such as can be used in semiconductor photolithographic processing. It is understood, however, that the following disclosure provides many different embodiments, or examples, for implementing different features of the invention. Specific examples of components and arrangements are described below to simplify the present disclosure. These are, of course, merely examples and are not intended to limit the invention from that described in the claims.

In the following description of various embodiments of the present invention, the same numerals and/or letters may be used in the various embodiments. This repetition is for the purpose of clarity and does not in itself indicate a relationship between the various embodiments and/or configurations discussed.

Figure 1:
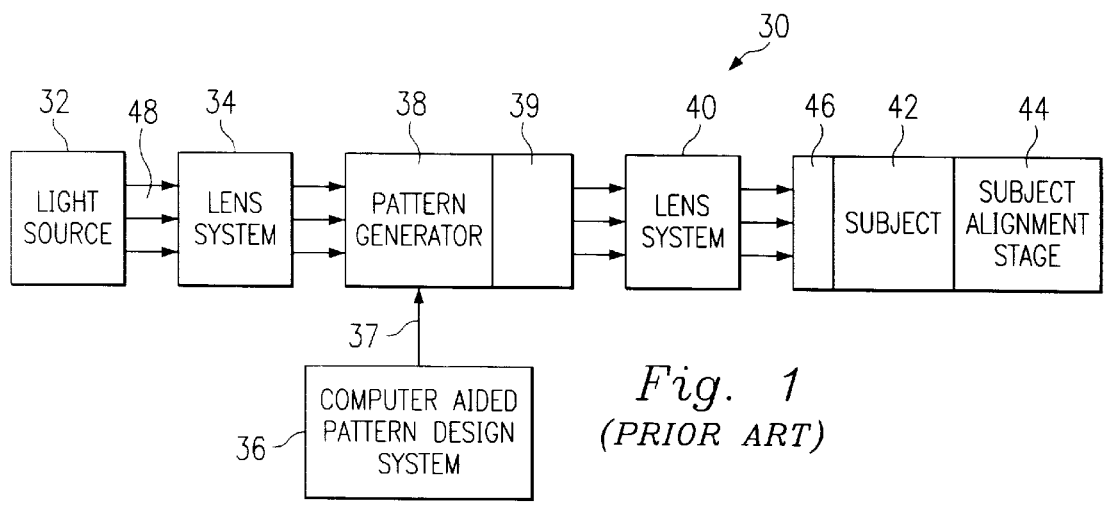
FIG. 1 is a block diagram of a photolithography system for implementing various embodiments of the present invention.

Referring now to FIG. 1, a maskless photolithography system 30, such as is described in U.S. Pat. Ser./No. 09/480,796 and hereby incorporated as if reproduced in its entirety, is one example of a system that can benefit from the present invention. In the present example, the maskless photolithography system 30 includes a light source 32, a first lens system 34, a computer aided pattern design system 36, a pixel panel 38, a panel alignment stage 39, a second lens system 40, a subject 42, and a subject stage 44. A resist layer or coating 46 may be disposed on the subject 42. The light source 32 may be an incoherent light source (e.g., a Mercury lamp) that provides a collimated beam of light 48 which is projected through the first lens system 34 and onto the pixel panel 38.

The pixel panel 38 is provided with digital data via suitable signal line(s) 37 from the computer aided pattern design system 36 to create a desired pixel pattern (the pixel-mask pattern). The pixel-mask pattern may be available and resident at the pixel panel 38 for a desired, specific duration. Light emanating from (or through) the pixel-mask pattern of the pixel panel 38 then passes through the second lens system 40 and onto the subject 42. In this manner, the pixel-mask pattern is projected onto the resist coating 46 of the subject 42.

The computer aided mask design system 36 can be used for the creation of the digital data for the pixel-mask pattern. The computer aided pattern design system 36 may include computer aided design (CAD) software similar to that which is currently used for the creation of mask data for use in the manufacture of a conventional printed mask. Any modifications and/or changes required in the pixel-mask pattern can be made using the computer aided pattern design system 36. Therefore, any given pixel-mask pattern can be changed, as needed, almost instantly with the use of an appropriate instruction from the computer aided pattern design system 36. The computer aided mask design system 36 can also be used for adjusting a scale of the pattern or for correcting image distortion in the pattern.

In some embodiments, it may be desirable to increase the size of the site being exposed and/or to increase the resolution of the site. If the pixel panel 38 is a digital light processor (DLP) or digital mirror device (DMD) such as is illustrated in U.S. Pat. No. 5,079,544 and patents referenced therein, current technology provides a 600×800 array of mirrors for a set of potential pixel elements. For the sake of simplicity and clarity, the pixel panel 38 will be further illustrated as one or more DMDs.

Figure 2:
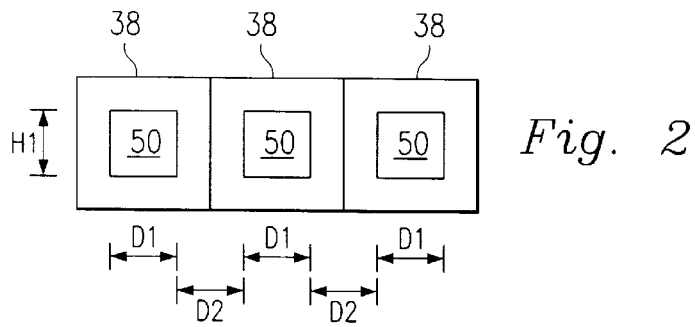
FIG. 2 illustrates one possible arrangement of pixel panels for use in the photolithography system of FIG. 1.

Referring now to FIG. 2, in one embodiment, three DMDs 38 can be aligned side by side to produce four pixel mask patterns 50. Each pixel mask pattern 50 is of a specific width d1 and specific height h1. It is noted that even when the three DMDs 38 are pressed against each other, the corresponding pixel mask patterns 50 are always separated by a minimum distance d2. It may be desirable to make the separation distance d2 to be equal to or less that zero because, if the separation distance d2 is less than zero, then some overlap can occur between adjacent pixel mask patterns 50. This overlap provides for greater reliability and redundancy.

Figure 3:
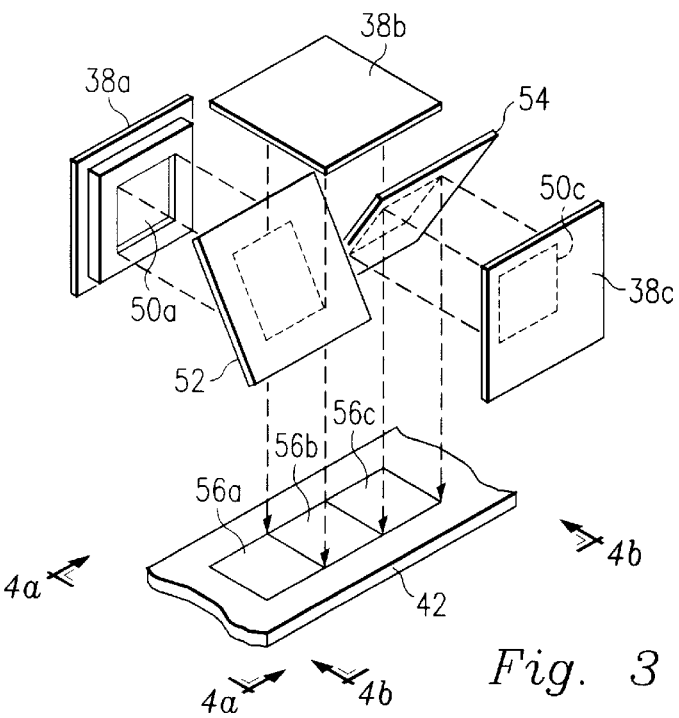
FIGS. 3, 4a, 4b illustrates another possible arrangement of pixel panels and reflecting surfaces for use in the photolithography system of FIG. 1.
Figures 4A, 4B:
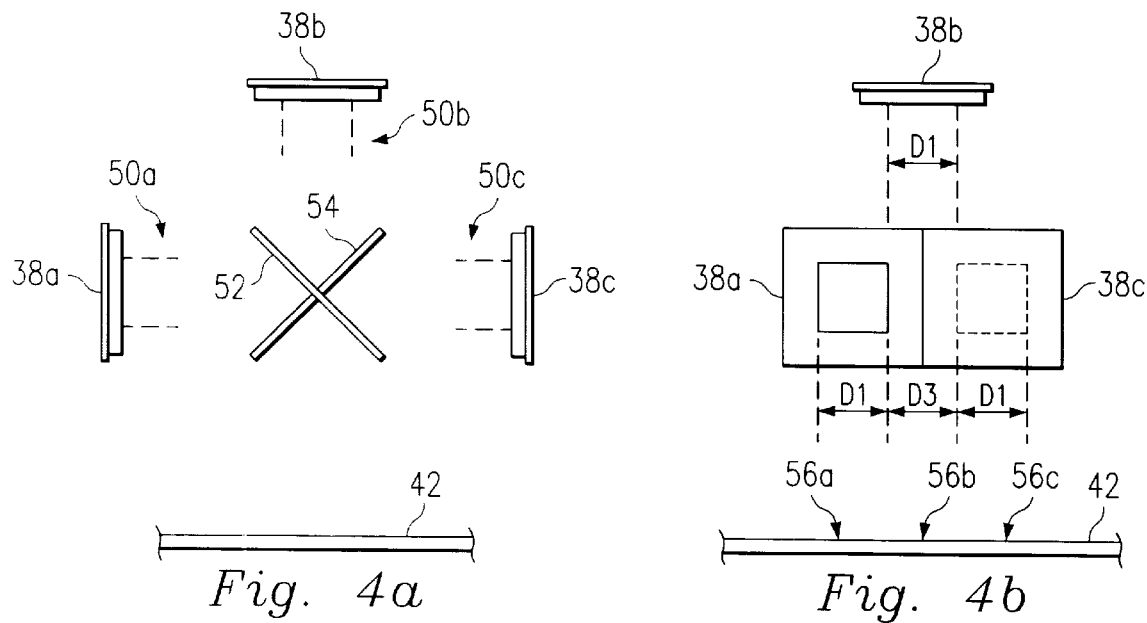

Referring now to FIGS. 3, 4a, and 4b, in a preferred embodiment, the DMDs 38 are separated from each other, rotated, and spatially arranged. For the sake of reference, the three DMDs are designated 38a, 38b, 38c and their corresponding pixel mask patterns and/or projection images are designated 50a, 50b, 50c, respectively. The DMDs 38a and 38c are each associated with a reflection device 52, 54, respectively. The reflection devices 52, 54 may be mirrors, prisms, or any other suitable reflection device. Furthermore, the reflection devices 52, 54 may be separate or may be formed from a single monolithic substrate. For the sake of simplicity and clarity, the devices 52, 54 are illustrated as mirrors. Also for the sake of simplicity and clarity, any intervening lenses have been left out of these figures and the following description.

The DMD 38a projects the image 50a onto the mirror 52, which further directs the image 50a onto the subject 42 at a site 56a. The DMD 38b projects the image 50b directly onto the subject 42 at a site 56b adjacent to, or overlapping with, the site 56a. The DMD 38c projects the image 50c onto the mirror 54, which further directs the image 50c onto the subject 42 at a site 56c adjacent to, or overlapping with, the site 56b. Referring specifically to FIG. 4b, in this arrangement, a distance d3 between the images 50a and 50c is less than or equal to the width d1.

Figure 5:
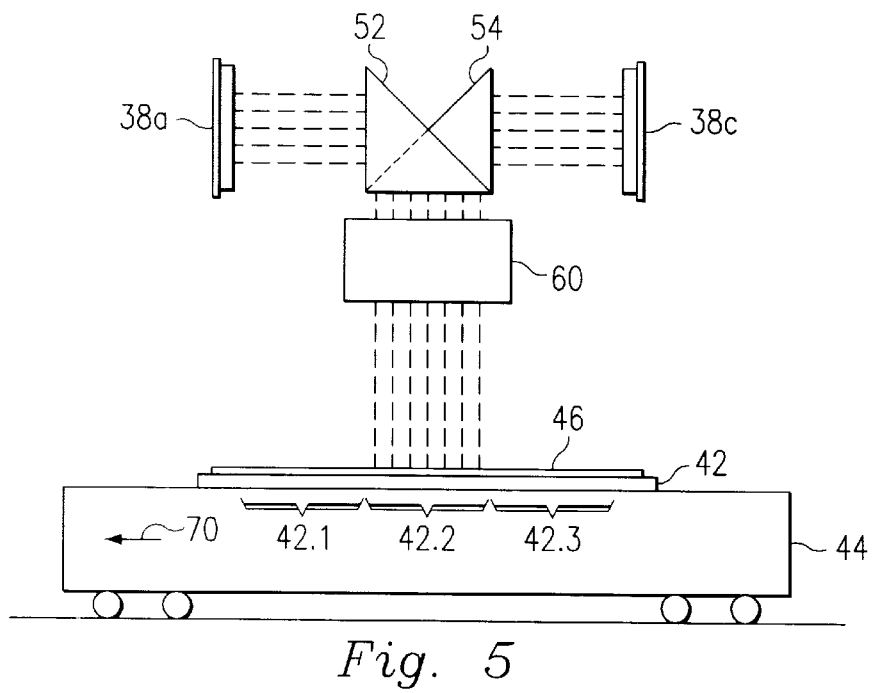
FIG. 5 illustrates a subject being image scanned by the pixel panels and reflecting surfaces of FIG. 2.

Referring now to FIG. 5, in some embodiments, a gradient lens 60 can form a portion or all of the lens system 40. Examples of a gradient lens include a lens plate, a lens array, and a planar microlens array, which are all sold under the brand name SELFOC by Nippon Sheet Glass Company, Limited, of Osaka, Japan. In the present embodiment, the gradient lens system 60 is an array of lenses that provide a 1:1 image transfer without inverting the image. These types of lenses are often used in copy machines, facsimile machines, and the like.

In operation, the images from the DMDs 38a, 38c reflect off of the mirrors 52, 54, respectively, and through the lens system 60. The lens system 60 further directs the images to the subject 42, e.g., a wafer, and exposes the photo resist 46 thereon. The present system can be used for image scanning, whereby the images from the DMDs 38a, 38c are scanned and moved across the subject 42 responsive to the relative scanning movement between the two (represented by an arrow 70).

Figure 6:
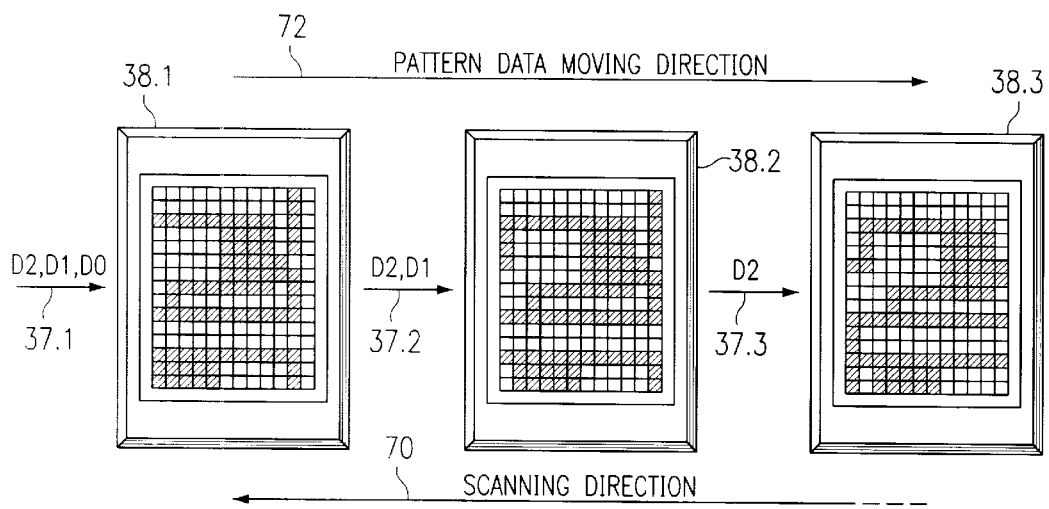
FIG. 6 illustrates a pixel pattern moving across one of the pixel panels of FIG. 3.

Referring also to FIG. 6, corresponding to the image scanning described above, the pixel-mask pattern being projected by the DMDs 38 changes accordingly. This correspondence can be provided, in one embodiment, by having the computer system 36 of FIG. 1 control both the scanning movement 70 and the data provided to the DMDs 38. The illustrations of FIG. 6 and the following discussion describe how the data can be timely provided to the DMDs 38.

FIG. 6 shows three intermediate images of one of the DMDs 38 and the corresponding signal lines 37, each with a suffix "0.1", "0.2", or "0.3". The signals 37.1, 37.2, 37.3 and DMDs 38.1, 38.2, 38.3 correspond to portions 42.1, 42.2, 42.3, respectively, of the subject 42. Each portion may include a plurality of sites, such as the sites 56a, 56b, 56c of FIG. 3. It is understood that the illustrated spacing between the portions 42.1, 42.2, 42.3 is exaggerated for the sake of clarity, and since the pattern is image scanned, overlapping between portions may actually occur.

In the first intermediate image, the pattern of DMD 38.1 is created responsive to receiving data D0 provided through the signal lines 37.1. In the present example, the pattern is created as a matrix of pixel elements in the DMD 38.1. After a predetermined period of time (e.g., due to exposure considerations being met), the pattern is shifted. The shifted pattern, shown as DMD 38.2, includes additional data D1 provided through the signal lines 38.2. The shifting between patterns may also utilize a strobing or shuttering of the light source 32. In the second intermediate image of FIG. 6, D1 represents the left-most column of pixel elements in the pattern of DMD 38.2. After another predetermined period of time, the pattern (now shown as DMD 38.3) is shifted again. The twice-shifted pattern includes additional data D2 provided through the signal lines 38.2. In the third intermediate image of FIG. 6, D2 now represents the left-most column of pixel elements in the pattern of the DMD38.3. Thus, the pattern moves across the DMD 38 in a direction 72. It is noted that the pattern direction 72, as it is being provided to the DMD 38 from the signal lines 37, is moving opposite to the scanning direction 70.

Figure 7:
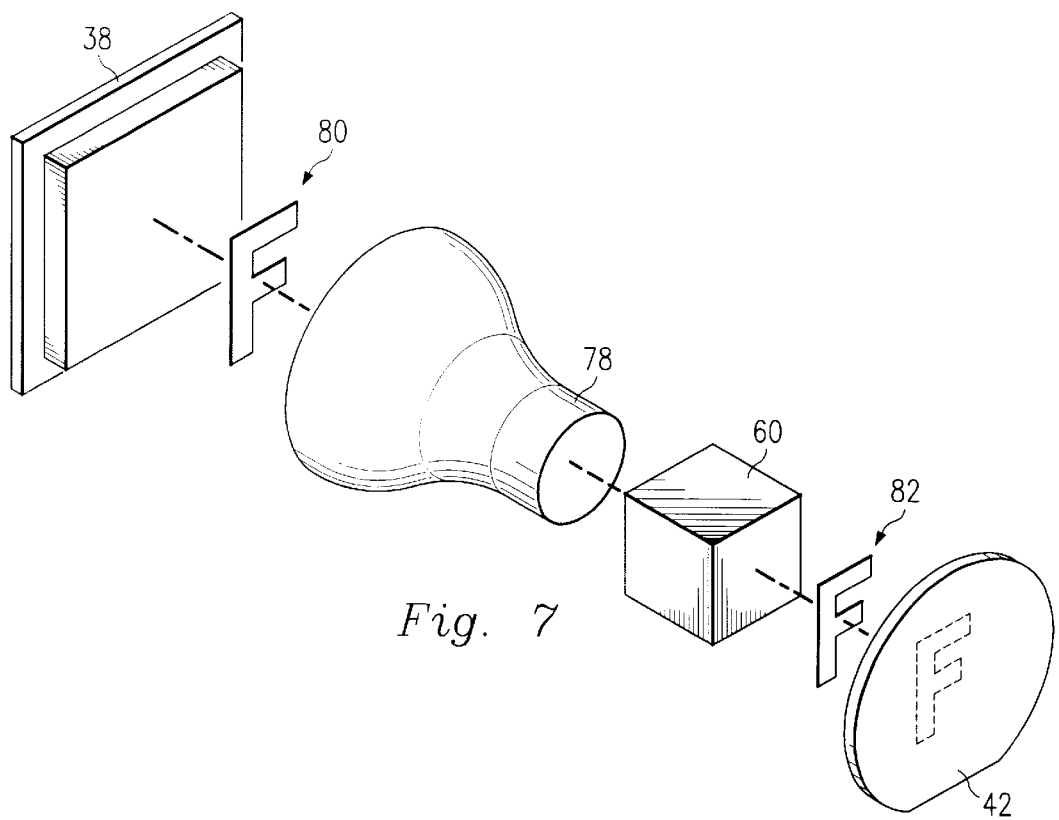
FIG. 7 illustrates a pattern reducer for shrinking an image size for one of the pixel panels of FIG. 3.

Referring now to FIG. 7, in some embodiments, it may be desirable to provide a higher resolution of the images from the pixel mask pattern onto the subject 42. This may be accomplished, for example, by inserting a pattern reducer 78 in line between the DMD 38 and the subject 42. In one embodiment, the pattern reducer 78 may be a Schott fiber optic taper, such as sold by Edmund Industrial Optics of Barrington, N.J. A fiber optic taper is a coherent fiber optic plate that transmits a reduced image from its input surface to its output surface. Thus, in the embodiment of FIG. 7, an image 80 produced by the DMD 38 appears as a reduced image 82 on the subject 42 because of the pattern reducer 78. The pattern reducer 78 may, in some embodiments, be positioned adjacent to the gradient lens system 60.

Figure 8:
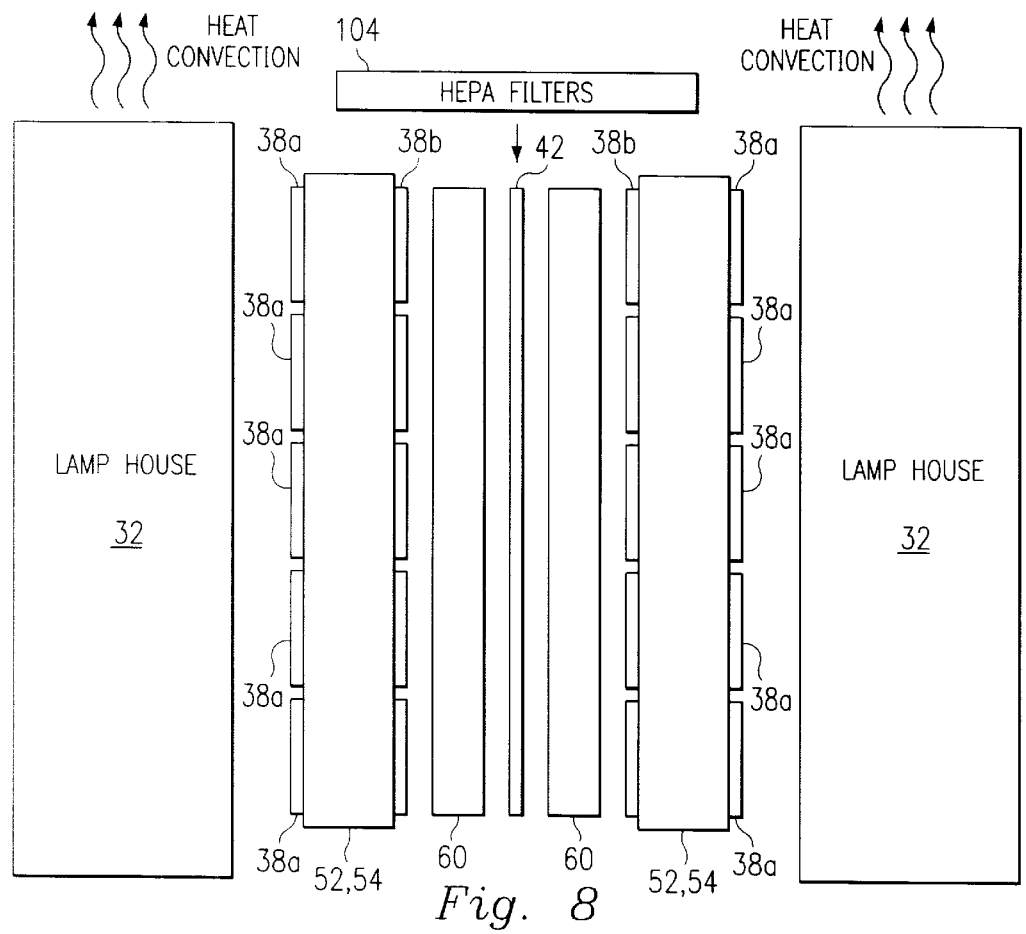
FIGS. 8–9 illustrate another embodiment of a photolithography system for exposing multiple surfaces of a substrate.
Figure 9:
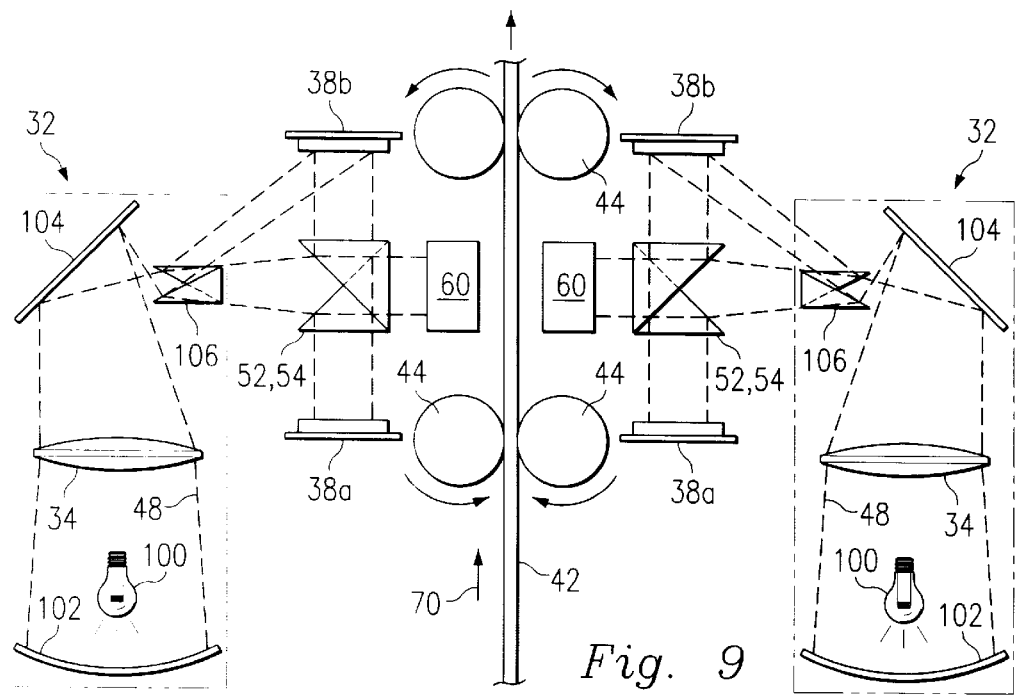

Referring now to FIGS. 8 and 9, in another embodiment, the system can be used to perform multiple surface exposures. A plurality of DMDs 38a, 38b are positioned accordingly with the mirrors 52, 54 on each side of the subject 42. Two gradient lens systems 60 are also positioned on each side of the subject 42. The stage 44 for the subject 42 is configured to support and move the subject, but to also allow both sides of the subject to be exposed. In the present embodiment, the stage 44 consists of rollers on either side of the subject 42, it being understood that other embodiments may also be used.

The light source 32 (e.g., a Mercury lamp 100 and associated mirror 102) projects the light 48 through the lens system 34 and onto a Hepa filter 104. The Hepa filter 104 directs the light 48, using a diverter 106, to the pixel panels 38a, 38b. The pixel panels 38a, 38b project the light through the mirrors 52, 54, through the gradient lens system 60, and onto one side of the subject 42. This process occurs on both sides of the subject. The subject 42 is scanned in the direction 70 so that the images from the pixel panels 38 are image scanned onto both sides of the subject.

Figure 10:
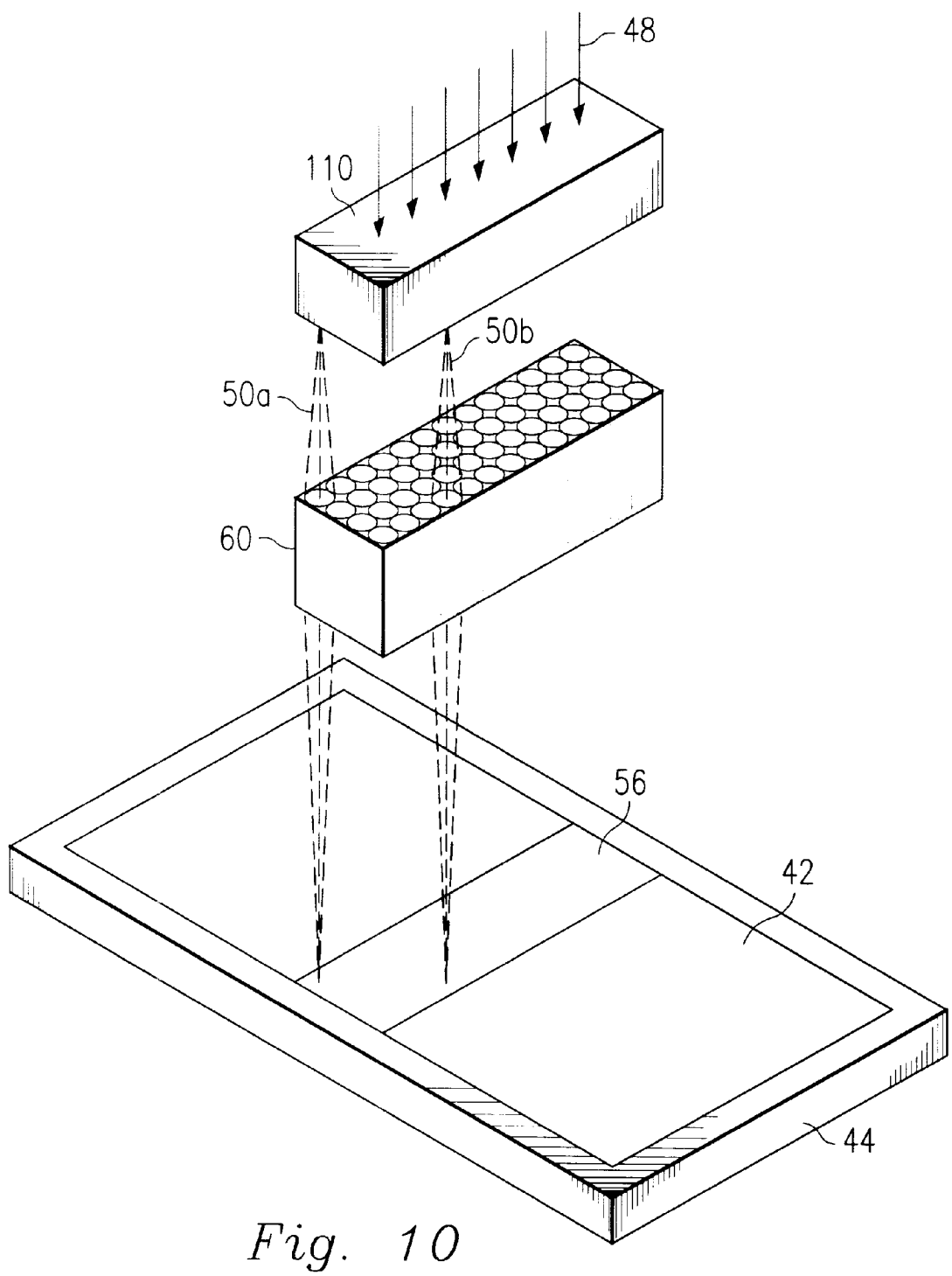
FIG. 10 illustrates still another arrangement for use in the system of FIG. 1, the arrangement utilizing a hyper spatial light modulator and a lens system.

Referring now to FIG. 10, in an alternative embodiment, a hyper spatial light modulator 110 is positioned above a subject 42 and a stage 44. The modulator 110 may receive data signals through the signal lines 37 from the design system 36 of FIG. 1. The modulator uses these signals to redirect light 48 into an image pattern, illustrated by exemplary pixels 50a, 50b. The modulator 110 projects the pattern through a gradient lens 60, which in the present embodiment is a lens array. The lens 60 focuses the image onto a site 56 on the subject 42.

Figure 12:
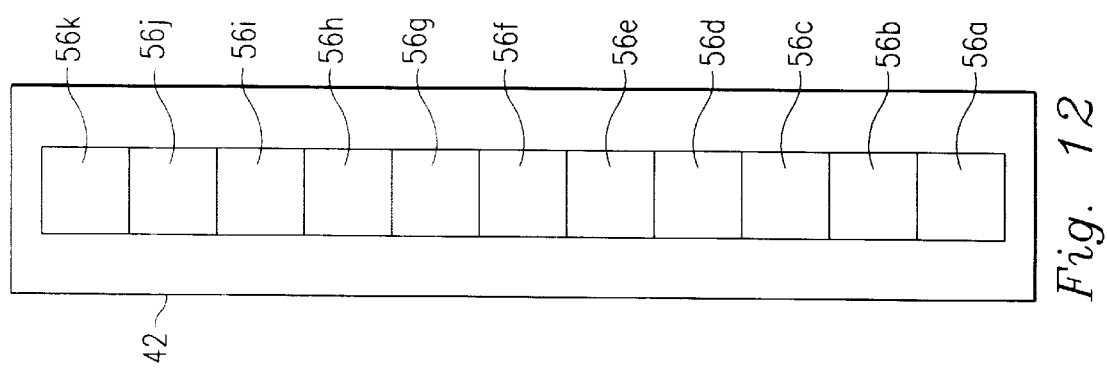
FIG. 12 illustrates a subject being scanned by the pixel panels and reflecting surfaces of FIG. 11.
Figure 11:
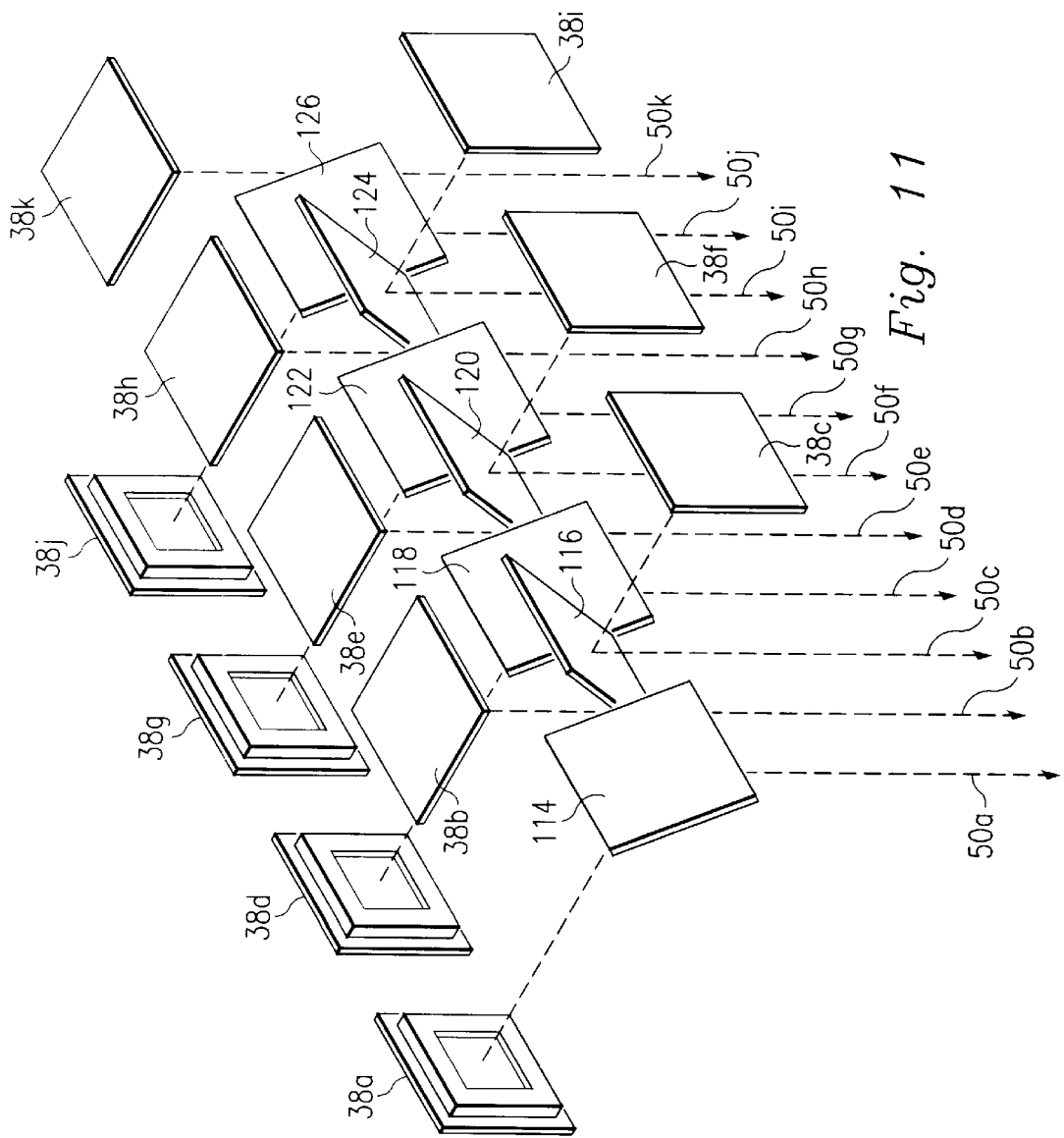
FIG. 11 illustrates using multiple panels and reflecting surfaces to expand the system of FIG. 3.

Referring now to FIGS. 11 and 12, in another embodiment, a plurality of DMDs 38a–k and mirrors 114–126 are utilized to project a plurality of images 50a–k (each illustrated by a single line in FIG. 11 for clarity) onto a plurality of sites 56a–k on a subject 42 of FIG. 12 in a manner similar to that illustrated in FIG. 3. The DMDs 38a–k are separated from each other, rotated, and spatially arranged as shown. The DMDs 38a, 38c, 38d, 38f, 38g, 38i, and 38j are associated with the mirrors 114–126, respectively.

As in FIG. 3, the DMD 38a projects the image 50a onto the mirror 114, which further directs the image 50a onto the subject 42 at the site 56a of FIG. 12. The DMD 38b projects the image 50b directly onto the subject 42 at the site 56b adjacent to, or overlapping with, the site 56a. The DMD 38c projects the image 50c onto the mirror 116, which further directs the image 50c onto the subject 42 at the site 56c adjacent to, or overlapping with, the site 56b.

The DMD 38d projects the image 50d onto the mirror 118, which further directs the image 50d onto the subject 42 at the site 56d adjacent to, or overlapping with, the site 56c. The DMD 38e projects the image 50e directly onto the subject 42 at the site 56e adjacent to, or overlapping with, the site 56d. The DMD 38f projects the image 50f onto the mirror 120, which further directs the image 50f onto the subject 42 at the site 56f adjacent to, or overlapping with, the site 56e. This arrangement may be continued as desired, with each exposed site adjacent to or overlapping the preceding site. Additional DMDs 38g–k, which operate in the same manner in conjunction with the mirrors 122–126 to expose sites 56g–k, are shown for purposes of illustration but are not described.

Referring now specifically to FIG. 12, exemplary adjacent sites 56a–k, such as may be projected by the DMDs 38a–k of FIG. 11, are illustrated on a portion of a subject 42. The sites 56a–k may be adjacent or overlapping, depending on the desired behavior of the DMDs 38a–k of FIG. 11.

Figure 13:
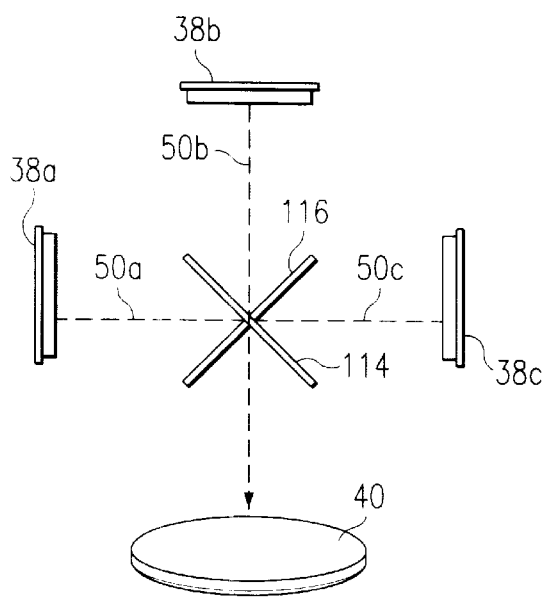
FIG. 13 illustrates the system of FIG. 3 with the addition of a lens.
Figure 13:
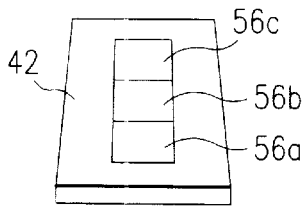

Referring now to FIG. 13, in another embodiment, three DMDs 38a–c and two mirrors 114, 116 are arranged similarly to those illustrated in FIGS. 3, 4a, and 4b, except that a lens system 40 is positioned between the DMDs 38a–c/mirrors 114, 116 and the subject 42. The lens system 40 may comprise a gradient lens or any other type of lens, and may be a single lens or multiple lenses. The lens system 40 may be designed to focus, redirect, or otherwise project light which is directed to the lens system 40.

The DMD 38a projects an image 50a (illustrated by a single line for clarity) onto the mirror 114, which further directs the image 50a onto the lens system 40. The lens system 40 projects the image 50a onto the subject 42 at the site 56a. The DMD 38b projects the image 50b directly onto the lens system 40, which projects the image 50b onto the subject 42 at the site 56b adjacent to, or overlapping with, the site 56a. The DMD 38c projects the image 50c onto the mirror 116, which further directs the image 50c onto the lens system 40. The lens system 40 projects the image 50c onto the subject 42 at the site 56c adjacent to, or overlapping with, the site 56b.

Figure 14:
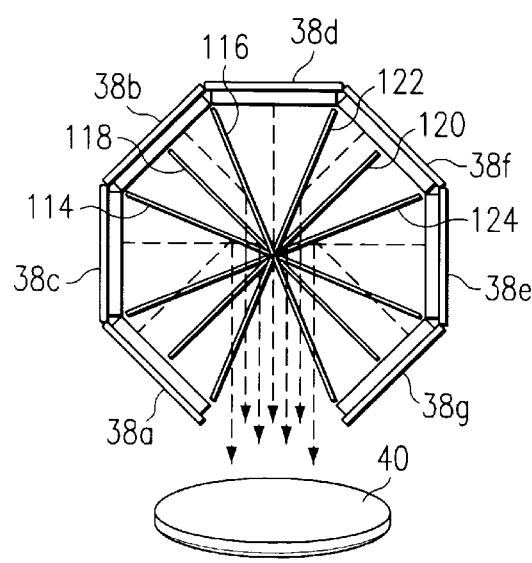
FIG. 14 illustrates the system of FIG. 13 with additional panels and reflecting surfaces.
Figure 14:
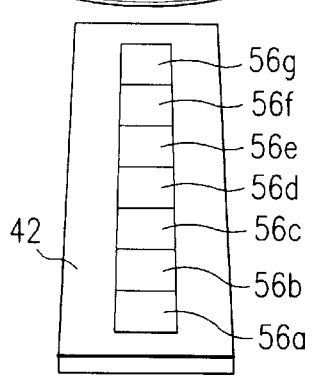

Referring now to FIG. 14, in another embodiment, a plurality of DMDs 38a–g, a plurality of mirrors 114–124, and a lens system 40 are arranged similarly to those illustrated in FIG. 13. The DMDs 38a–g are separated from each other, rotated, and spatially arranged as shown. The DMDs 38a, 38b, 38c, 38e, 38f, and 38g are associated with the mirrors 114–124, respectively.

The DMDs 38a–c project an image 50a–c, respectively (illustrated by a single line for clarity) onto the mirrors 114–118. The mirrors 114–118 direct their associated images 50a–c onto the lens system 40. The lens system 40 projects the images 50a–c onto a subject 42 at sites 56a–c. Each site 56b, 56c is adjacent to, or overlapping with, the preceding site 56a, 56b, respectively. The DMD 38d projects an image 50d directly onto the lens system 40, which projects the image 50d onto the subject 42 at the site 56d adjacent to, or overlapping with, the site 56c. The DMDs 38e–g project an image 50e–g, respectively (illustrated by a single line for clarity) onto the mirrors 120–124. The mirrors 120–124 direct their associated images 50e–g onto the lens system 40. The lens system 40 projects the images 50e–g onto a subject 42 at sites 56e–g. Each site 56e–g is adjacent to, or overlapping with, the preceding site 56d–f, respectively.

Figure 15:
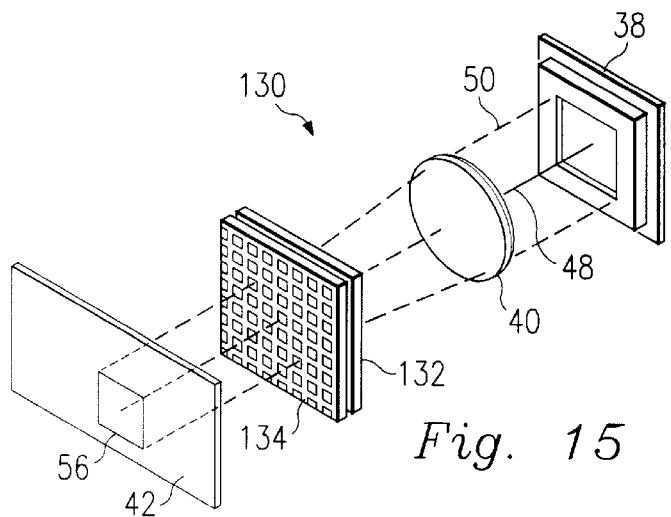
FIG. 15 illustrates an exemplary point array unit.

Referring now to FIG. 15, a point array unit 130 may include a DMD 38, a lens system 40, a microlens array 132, and a grating 134. The unit 130 may be used in place of a DMD to achieve a higher resolution for an exposure site. In operation, the DMD 38 receives data signals through the signal lines 37 (not shown) from the design system 36 of FIG. 1. The DMD 38 uses these signals to reflect light 48 as an image pattern 50. The pattern 50 is projected through the lens system 40, which may serve to focus or redirect the image 50 onto the microlens array 132. The microlens array 132 may be a compilation of individual microlenses that correspond to one or more of a plurality of individual pixels of the DMD 38. In the present embodiments, there are as many individual microlenses as there are pixel elements DMD 38. For example, if the DMD 38 has 600×800 pixels, then the microlens array 132 may have 600×800 microlenses. In other embodiments, the number of lenses may be different from the number of pixel elements in the DMD 38. In these embodiments, a single microlens may accommodate multiple pixels elements of the DMD, or the pixel elements can be modified to account for alignment.

The microlens array 132 projects the image 50 onto the grating 134. The grating may be a conventional shadow mask device that is used to eliminate and/or reduce certain bandwidths of light and/or diffractions between individual pixels of the DMD 38 and/or the microlens array 132. The grating 134 may take on various forms, and in some embodiments, may be replaced with another device or not used at all. The light passes through the grating 134 and exposes a site 56 on a subject 42.

Figure 16:
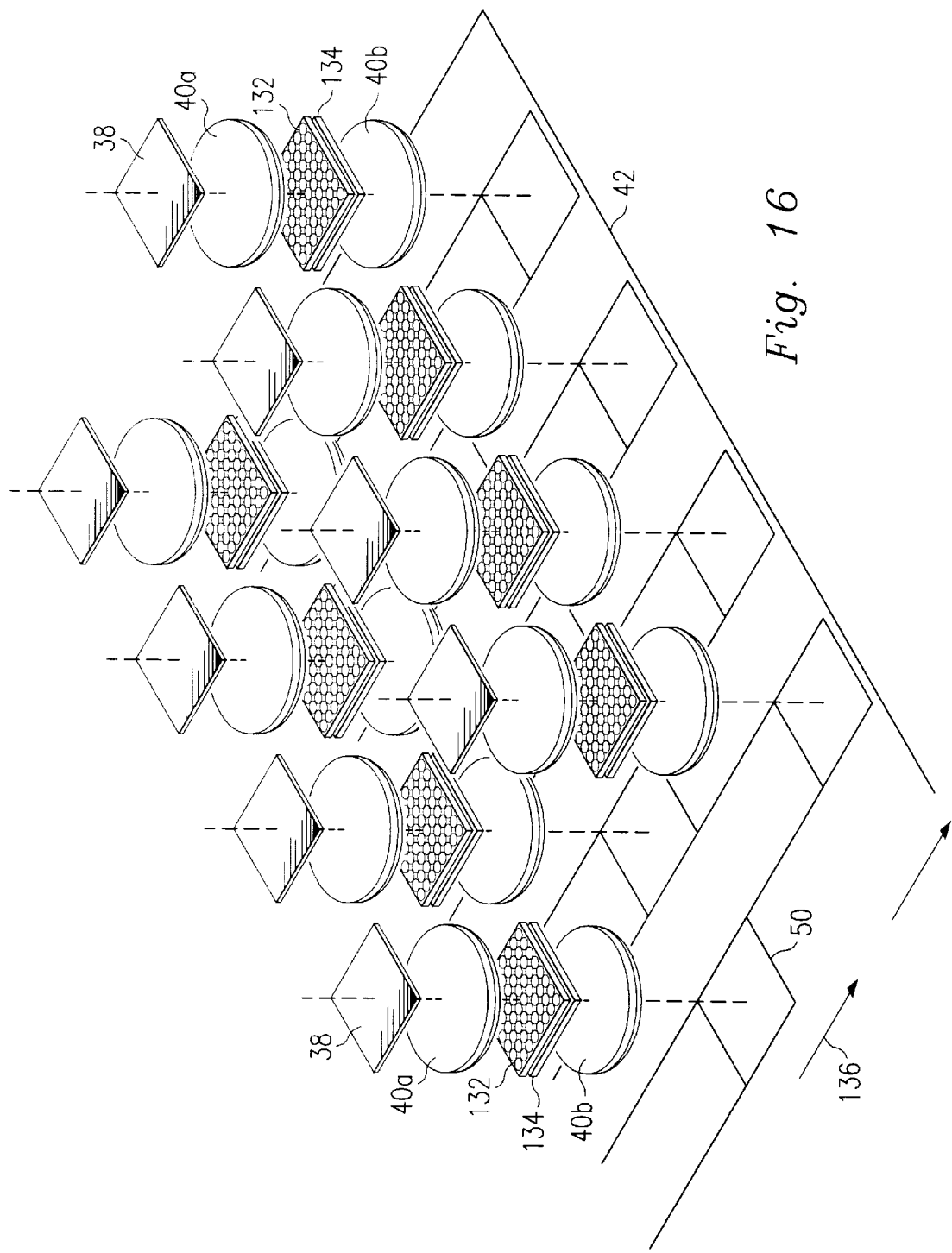
FIG. 16 illustrates the system of FIG. 1 using a plurality of the point array units of FIG. 15 to scan a subject.

Referring now to FIG. 16, a plurality of the point array units 130 of FIG. 15 are illustrated. In addition, a second lens system 40b has been added to the units 130 between the grating 134 and the subject 42. The lens systems 40b may be used to focus or redirect the images 50 onto the sites 56. The plurality of units 130 enable the simultaneous exposure of the plurality of sites 56 on the subject 42 through a stage scanning process in the direction 136. It is noted that all units may be operating simultaneously, selected units may be operating, or no units may be operating at any given time, depending on the desired results. It is also noted that other scanning methods may be utilized to achieve the results of the stage scanning of FIG. 16.

While the invention has been particularly shown and described with reference to the preferred embodiment thereof, it will be understood by those skilled in the art that various changes in form and detail may be made therein without departing from the spirit and scope of the invention. For example, it is within the scope of the present invention that alternate types and/or arrangements of microlenses, pixel panels and/or lenses may be used. Furthermore, the order of components such as the microlens array 132, the lenses 40, and/or the grating 134 may be altered in ways apparent to those skilled in the art. Additionally, the type and number of components may be supplemented, reduced or otherwise altered. Therefore, the claims should be interpreted in a broad manner, consistent with the present invention.

What is claimed is:

1. A system for image-scanning a pixel-mask pattern onto a subject, the system comprising:

first and second panels for generating first and second patterns, each pattern comprising a plurality of pixel elements;

a first mirror for diverting the pixel elements of the first pattern to align with non-diverted pixel elements of the second pattern, wherein the mirror is disposed relative to the first and second panels to prevent the second panel from interfering with the first pattern and to prevent the first panel from interfering with the second pattern;

a first gradient lens system positioned between the first and second panels and the subject for simultaneously directing the pixel elements to the subject;

means for providing relative movement between the first and second panels and the subject to scan the pixel elements across the subject; and a pattern reducer positioned between the panels and the first gradient lens system for shrinking an effective size of the pixel mask pattern.

2. The system of claim 1 wherein the pixel elements of the first pattern are exposed on the subject simultaneously with the pixel elements of the second pattern.

3. The system of claim 1 wherein the pixel elements of the first pattern overlap the pixel elements of the second pattern when scanned on the subject.

4. A system for image-scanning a pixel-mask pattern onto a subject, the system comprising:

first and second panels for generating first and second patterns, each pattern comprising a plurality of pixel elements;

a first mirror for diverting the pixel elements of the first pattern to align with the pixel elements of the second pattern;

a first gradient lens system positioned between the first and second panels and the subject for simultaneously directing the pixel elements to the subject;

means for providing relative movement between the first and second panels and the subject to scan the pixel elements across the subject; and a pattern reducer positioned between the panels and the gradient lens system for shrinking an effective size of the pixel mask pattern.

5. The system of claim 1 wherein the gradient lens system is an array of lenses with a 1:1 image transfer ratio.

6. The system of claim 1 further comprising:
third and fourth panels for generating third and fourth patterns, each pattern comprising a plurality of pixel elements;
a second mirror for diverting the pixel elements of the third pattern to align with the pixel elements of the fourth pattern; and
a second gradient lens system positioned between the third and fourth panels and the subject for simultaneously directing the pixel elements to the subject;
wherein the pixel elements from the first and second panels are scanned across a first surface of the subject, and the pixel elements from the third and fourth panels are scanned across a second surface of the subject.

7. A system for image-scanning a pixel-mask pattern onto a subject, the system comprising:
first, second, third and fourth panels for generating first, second, third, and fourth patterns, respectively, each pattern comprising a plurality of pixel elements;
a first mirror for diverting the pixel elements of the first pattern to align with the pixel elements of the second pattern;
a second mirror for diverting the pixel elements of the third pattern to align with the pixel elements of the fourth pattern;
a first gradient lens system positioned between the first and second panels and the subject for simultaneously directing the pixel elements to the subject;
a second gradient lens system positioned between the third and fourth panels and the subject for simultaneously directing the pixel elements to the subject; and
means for providing relative movement between the first and second panels and the subject to scan the pixel elements across the subject,
wherein the pixel elements from the first and second panels are scanned across a first surface of the subject, and the pixel elements from the third and fourth panels are scanned across a second surface of the subject, and
wherein the first and second surfaces are on opposite sides of the subject.

8. A system for image-scanning a pixel-mask pattern onto a subject, the system comprising:
first, second, third and fourth panels for generating first, second, third, and fourth patterns, respectively, each pattern comprising a plurality of pixel elements;
a first mirror for diverting the pixel elements of the first pattern to align with the pixel elements of the second pattern;
a second mirror for diverting the pixel elements of the third pattern to align with the pixel elements of the fourth pattern;
a first gradient lens system positioned between the first and second panels and the subject for simultaneously directing the pixel elements to the subject;
a second gradient lens system positioned between the third and fourth panels and the subject for simultaneously directing the pixel elements to the subject; and
means for providing relative movement between the first and second panels and the subject to scan the pixel elements across the subject,
wherein the pixel elements from the first and second panels are scanned across a first surface of the subject, and the pixel elements from the third and fourth panels are scanned across a second surface of the subject, and
wherein the scanning occurs simultaneously on the first and second surfaces of the subject.

9. The system of claim 1 further comprising:
a non-coherent light source for projecting the pattern using the panel.

10. The system of claim 1 further comprising:
a computing system for generating the pixel elements and providing the pixel elements to the panel in a predetermined sequence.

11. The system of claim 10 wherein the computing system is also used for designing the pattern.

12. The system of claim 10 wherein the computing system is also used for adjusting a scale of the pattern.

13. The system of claim 10 wherein the computing system is also used for correcting image distortion in the pattern.

14. A system for image-scanning a pixel-mask pattern onto a subject, the system comprising:
a point array unit, the unit including:
a panel for generating the pattern, the pattern comprising a plurality of pixel elements;
a first lens system positioned between the panel and the subject for directing the pixel elements to the subject;
a second lens system for focusing the pixel elements; and
a grating within the point array unit; and
means for providing relative movement between the unit and the subject to scan the pixel elements across the subject.

15. The system of claim 14 wherein the second lens system is a microlens array.

16. The system of claim 14 further including a third lens system positioned between the point array unit and the subject for focusing the pixel elements onto the subject.

17. The system of claim 14 further including a plurality of point array units for simultaneously scanning a plurality of pixel elements across the subject.

18. An imaging system for projecting a plurality of pixel patterns onto a subject during photolithography, the system comprising:
first, second and third panels having first, second and third portions, respectively, for projecting first, second and third pixel patterns, wherein each of the first, second and third portions is smaller than its respective panel;
a first reflection means for directing the first pixel pattern towards the subject; and
a second reflection means for directing the third pixel pattern towards the subject;
wherein the first panel is rotated relative to the second panel and wherein the third panel is rotated relative to the first and second panels, so that the first, second and third pixel patterns can be simultaneously projected onto adjacent portions of the subject without physical interference from the other panels.

19. The system of claim 18 wherein the first reflection means comprises a first surface operable to reflect the first pixel pattern and a second surface operable to let the second pixel pattern pass through the first reflection means without deflection.

20. The system of claim 19 wherein the first surface is substantially parallel to the second surface.

21. The system of claim 18 wherein the second panel is substantially parallel to the subject and the first panel is substantially perpendicular to the subject.

* * * * *